(12) United States Patent
Endo

(10) Patent No.: US 7,560,757 B2
(45) Date of Patent: Jul. 14, 2009

(54) SEMICONDUCTOR DEVICE WITH A STRUCTURE SUITABLE FOR MINIATURIZATION

(75) Inventor: Masato Endo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 11/220,598

(22) Filed: Sep. 8, 2005

(65) Prior Publication Data
US 2006/0278933 A1   Dec. 14, 2006

(30) Foreign Application Priority Data
Jun. 9, 2005   (JP)   ............... 2005-169679

(51) Int. Cl.
*H01L 29/94* (2006.01)
(52) U.S. Cl. .................. 257/288; 257/212; 257/213; 257/347; 257/401; 257/901; 257/E29.148; 257/E29.149
(58) Field of Classification Search ................ 257/212, 257/213, 288, 347, 401, E29.148, E29.149
See application file for complete search history.

(56) References Cited

U.S. PATENT DOCUMENTS

| | | | | |
|---|---|---|---|---|
| 4,409,723 | A * | 10/1983 | Harari | 438/257 |
| 5,406,509 | A * | 4/1995 | Ovshinsky et al. | 365/113 |
| 5,667,586 | A * | 9/1997 | Ek et al. | 117/84 |
| 6,043,535 | A * | 3/2000 | Houston | 257/345 |
| 6,172,395 | B1 * | 1/2001 | Chen et al. | 257/315 |
| 6,777,741 | B2 | 8/2004 | Rabkin et al. | |
| 6,787,423 | B1 * | 9/2004 | Xiang | 438/296 |
| 6,846,720 | B2 * | 1/2005 | Balasubramanian et al. | 438/424 |
| 6,891,209 | B2 * | 5/2005 | Bulsara et al. | 257/222 |
| 7,087,474 | B2 * | 8/2006 | Mitsuda et al. | 438/197 |
| 2006/0263992 | A1 * | 11/2006 | Chen et al. | 438/301 |

FOREIGN PATENT DOCUMENTS

| | | |
|---|---|---|
| JP | 10-92922 | 4/1998 |
| JP | 11-87697 | 3/1999 |
| JP | 2003-86799 | 3/2003 |
| JP | 2004-87671 | 3/2004 |
| JP | 2004-535063 | 11/2004 |
| KR | 2001-0004720 | 1/2001 |

OTHER PUBLICATIONS

L. Vescan, et al., "Lateral Confinement by Low Pressure Chemical Vapor Deposition-Based Selective Epitaxial Growth of $Si_{1-x}Ge_x/Si$ Nanostructures", J. Appl. Phys. 81 (10), May 15, 1997, pp. 6709-6715.

* cited by examiner

*Primary Examiner*—Wai-Sing Louie
*Assistant Examiner*—Marc Armand
(74) *Attorney, Agent, or Firm*—Oblon, Spivak, McClelland, Maier & Neustadt, P.C.

(57) ABSTRACT

A semiconductor device which is suitable for miniaturization, capable of improving variations in characteristics of a transistor and enhancing the current driving capability comprises a semiconductor substrate, an isolation protruding from the semiconductor substrate and having a width above the semiconductor substrate narrower than a width in the semiconductor substrate, a semiconductor layer formed on the semiconductor substrate portion between the isolations, and a MOSFET formed on the semiconductor layer.

14 Claims, 14 Drawing Sheets

SEMICONDUCTOR DEVICE WITH A STRUCTURE SUITABLE FOR MINIATURIZATION

CROSS-REFERENCE TO RELATED APPLICATIONS

This application is based upon and claims the benefit of priority from prior Japanese Patent Application No. 2005-169679, filed Jun. 9, 2005, the entire contents of which are incorporated herein by reference.

BACKGROUND OF THE INVENTION

1. Field of the Invention

The present invention relates to a semiconductor device and a manufacturing method thereof, and more particularly to a semiconductor device which is suitable for miniaturization and a manufacturing method thereof.

2. Description of the Related Art

As miniaturization of semiconductor devices progresses, various technologies have been developed in order to reduce an area of a semiconductor device.

An example of a prior art will now be described with reference to a non-volatile semiconductor storage device disclosed in U.S. Pat. No. 6,777,741. In the technology of this patent, a semiconductor film which serves as a part of a floating gate electrode is formed on a flat silicon substrate via a tunnel insulator. A groove for isolation is formed in the semiconductor film, the tunnel insulator and the silicon substrate, and then an isolation is formed in the groove. Furthermore, a second semiconductor film is selectively formed on the semiconductor film, whereby a floating gate electrode having a two-layered configuration is formed. In this technology, a width of the isolation is hard to be set narrower than a resolution of a lithography used.

In another technology, an isolation protruding from a semiconductor substrate is formed in advance. On the semiconductor substrate between the isolations, a semiconductor device, e.g., a metal oxide semiconductor field effect transistor (MOSFET), is formed. According to this technology, an alignment accuracy between the isolation formed in the semiconductor substrate and an active element formed on the semiconductor substrate can be improved, thereby a packing density of the semiconductor device can be improved. However, this technology has following problems.

FIG. 14 shows an example of a cross-sectional structure of a channel portion of a memory cell of a non-volatile semiconductor storage device using this technology. The illustrated structure is formed as follows.

First, a mask material (not shown) is deposited on a silicon substrate 10, an isolation groove 16t is formed in the mask material and the silicon substrate 10 by lithography and etching. The isolation groove 16t is filled with an insulator, thereby forming the isolation 16. After forming the isolations 16, the mask material is removed to expose a surface of the silicon substrate 10 between the isolations 16, and cell transistors 20 of the memory cell are formed on the exposed silicon surface. During removal of the mask material, a part of the isolation 16 adjacent to the silicon substrate is also removed, and thus an upper portion of the silicon substrate 10 is configured to slightly protrude as shown in FIG. 14. A floating gate electrode 24 is formed on this protruding silicon substrate 10 via a tunnel insulator 22.

A film thickness of the tunnel insulator 22 formed on the non-flat silicon substrate 10 varies depending on the shape of the substrate, which is flat on an upper surface and inclined on an end portion of the silicon substrate 10. In other word, the tunnel insulator 22 on the inclined part of the silicon substrate 10 is thinner than that on the flat part. As a result, a parasitic transistor 20' is formed on the inclined area, and the parasitic transistor 20' has characteristics different from those of the cell transistor 20 formed on the flat portion. When the parasitic transistor 20' is formed, variations are generated in characteristics of the semiconductor device, such as a breakdown voltage and tunneling current of the tunnel insulator. Variation in the tunneling current among the memory cells causes nonuniformity in an amount of electric charge injected into each floating gate electrode 24. Further, the floating gate electrode 24 has a shape protruding downwards on both sides, thereby electric field concentration is apt to occur there. These phenomena are combined so that electrical characteristics of the cell transistor 20 are deteriorated. For example, a kink is produced in gate voltage-source/drain current characteristics (I-V characteristics) or variation in a threshold voltage Vth is generated.

Furthermore, since a width of a channel area becomes narrower in a miniaturized MOSFET, there is another problem that source/drain current is difficult to increase.

Therefore, there is a need for a semiconductor device suitable for miniaturization and a manufacturing method thereof which can improve variations in characteristics of a transistor mentioned above and enhance a current driving capability.

BRIEF SUMMARY OF THE INVENTION

According to one aspect of the present invention, there is provided a semiconductor device comprising: a semiconductor substrate; an isolation protruding from the semiconductor substrate and having a width above the semiconductor substrate narrower than a width in the semiconductor substrate; a semiconductor layer formed on the semiconductor substrate portion between the isolations; and a MOSFET formed on the semiconductor layer.

According to another aspect of the present invention, there is provided a manufacturing method of a semiconductor device comprising: forming a first insulator on a semiconductor substrate; forming an isolation in the first insulator and the semiconductor substrate; removing the first insulator so that a part of the isolations protrude from the semiconductor substrate; reducing a width of the isolation in the part protruding from the semiconductor substrate; forming a semiconductor layer on the semiconductor substrate in an area between the isolations; forming a second insulator on the semiconductor layer; forming a conductor layer on the second insulator; and processing the conductor layer to form a gate electrode.

According to still another aspect of the present invention, there is provided a manufacturing method of a semiconductor device comprising: forming a first insulator on a semiconductor substrate; forming an isolation in the first insulator and the semiconductor substrate; removing the first insulator so that a part of the isolations protrude from the semiconductor substrate; reducing a width of the isolation in the part protruding from the semiconductor substrate; forming a semiconductor layer on the semiconductor substrate in an area between the isolations; forming a second insulator on the semiconductor layer; forming a first conductor layer on the second insulator; forming a third insulator on the first conductor layer; forming a second conductor layer on the third insulator; and processing the first and second conductor layers to form a gate electrode.

BRIEF DESCRIPTION OF THE SEVERAL VIEWS OF THE DRAWING

FIGS. 2A to 2D are cross-sectional views illustrating an example of a configuration of the semiconductor device according to the embodiment of the present invention, in which FIG. 2A is a cross-sectional view of a memory cell in a word line direction on a control gate electrode taken along a cutting-plane line 2A-2A in FIG. 1, FIG. 2B is a cross-sectional view of the memory cell in a bit line direction taken along a cutting-plane line 2B-2B in FIG. 1; FIG. 2C is a cross-sectional view of a MOSFET of a peripheral circuit in a channel width direction, and FIG. 2D is a cross-sectional view of the MOSFET of the periphery circuit in a channel length direction;

DETAILED DESCRIPTION OF THE INVENTION

Figure 1:
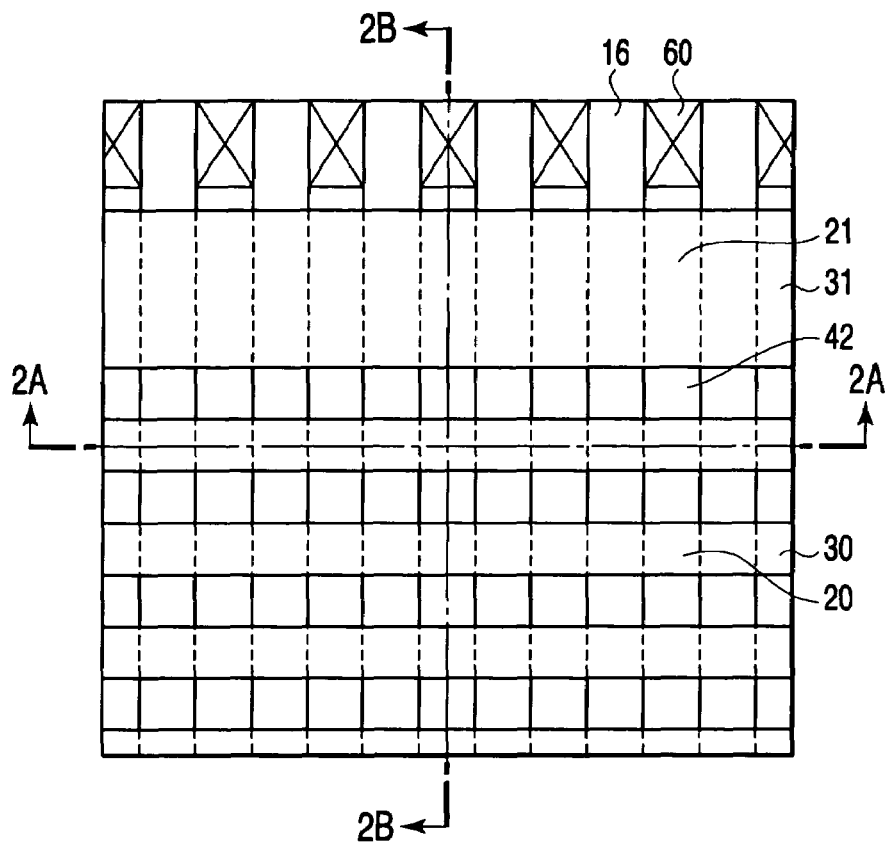
FIG. 1 is a drawing showing a plan layout view of a memory cell portion of a non-volatile semiconductor storage device according to an embodiment of the present invention.

The embodiments of the present invention will be described with reference to the accompanying drawings. Throughout the drawings, corresponding portions are denoted by corresponding reference numerals. Each of the following embodiments is illustrated as an example, and therefore the present invention can be variously modified and implemented without departing from the spirits of the present invention.

In a semiconductor device according to the present invention, prior to forming an active element such as a MOSFET, an isolation having a shape protruding from a semiconductor substrate is formed in advance. Thereafter, a width of the isolation protruding from the semiconductor substrate is reduced in a lateral direction, a semiconductor layer is selectively formed on the semiconductor substrate between the isolations, thereby increasing an active area and flattening a surface thereof, and the active element is formed on the semiconductor layer.

An embodiment according to the present invention will now be described in detail hereinafter taking a non-volatile semiconductor storage device as an example.

FIG. 1 is a drawing of a plan layout view of a memory cell excluding wirings of an NAND type non-volatile semiconductor storage device. An isolation 16 is formed in a vertical direction (which will be referred to as a bit line direction, hereinafter) in the drawing, and a plurality of cell transistors 20 are arranged in areas between the isolations 16. The plurality of cell transistors 20 is electrically connected in series in the bit line direction through a first diffusion layer 42. Control gate electrode 30 functioning as word line is formed in a horizontal direction (which will be referred to as a word line direction, hereinafter) in the drawing. A bit line select gate electrode 31 of a bit line select transistor 21 is arranged at one end (an upper side in the drawing) of each of the plurality of control gate electrodes 30, and a bit line contact 60 is disposed in proximity to the bit line select gate electrode 31.

Figure 2A:
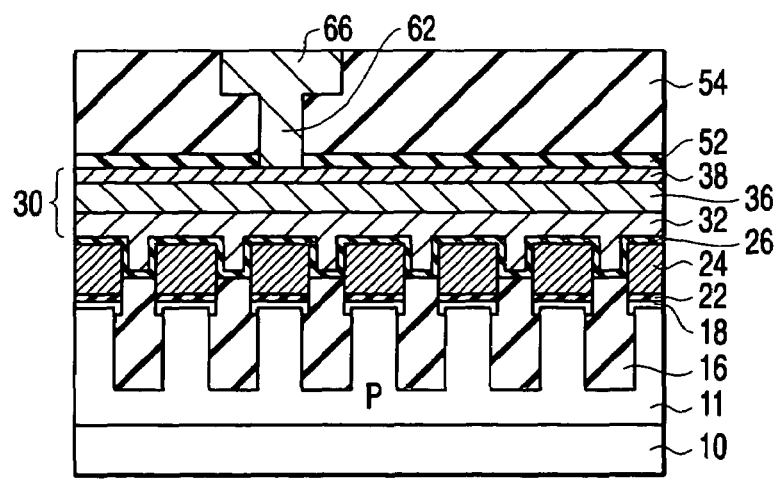
Figure 2B:
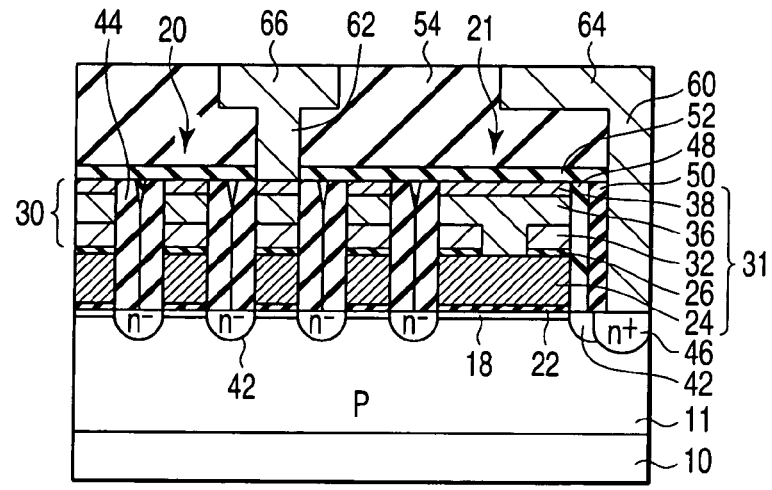
Figure 2C:
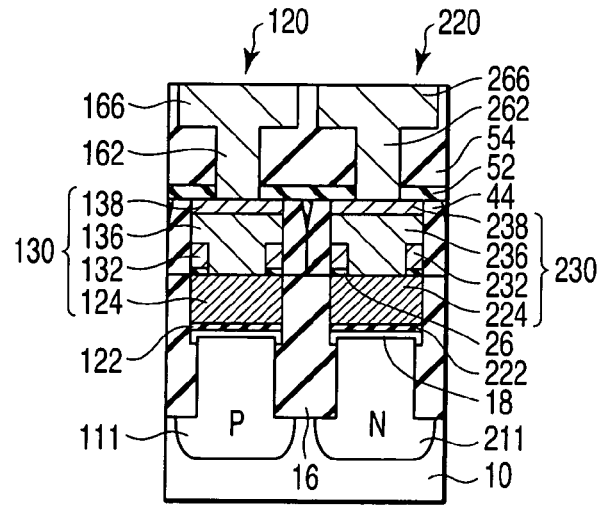
Figure 2D:
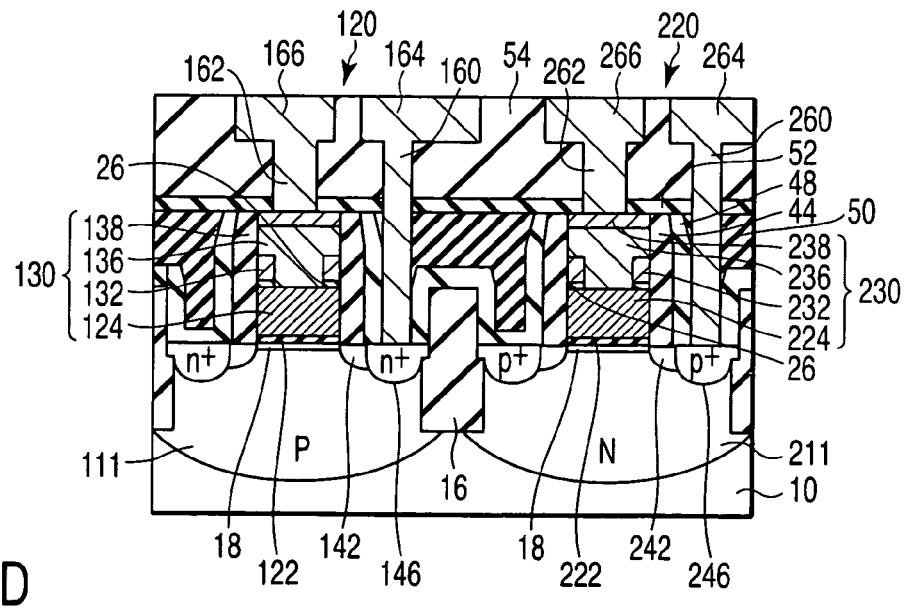
Figure 3A:
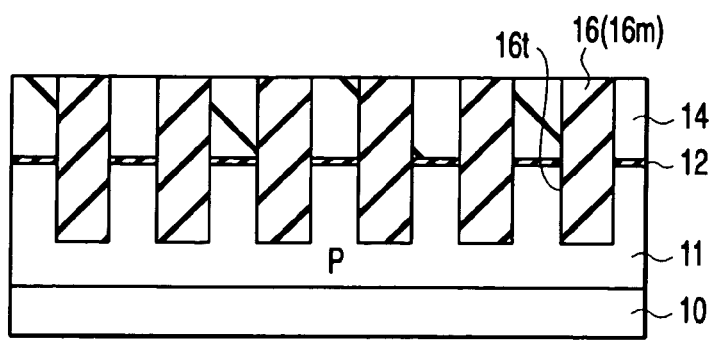
FIGS. 3A to 3D, 4A to 4D, 5A to 5D, 6A to 6D, 7A to 7D, 8A to 8D, 9A to 9D, 10A to 10D, 11A to 11D, 12A to 12D and 13A to 13D are cross-sectional views illustrating an example of manufacturing steps of a semiconductor device according to the embodiment of the present invention.
Figure 3B:
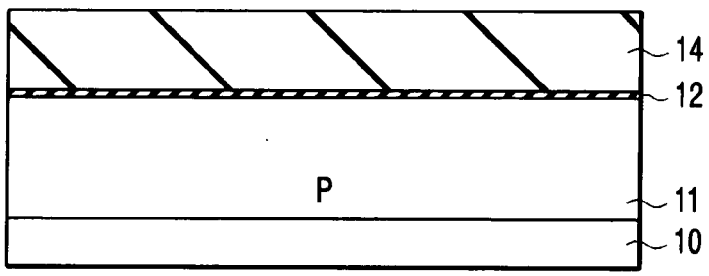
Figure 3C:
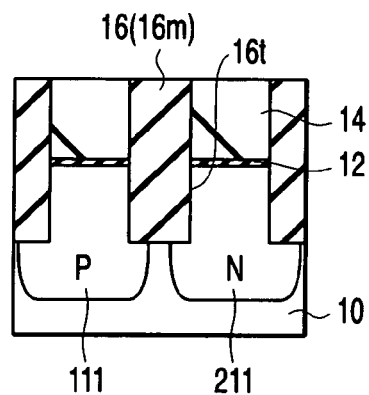
Figure 3D:
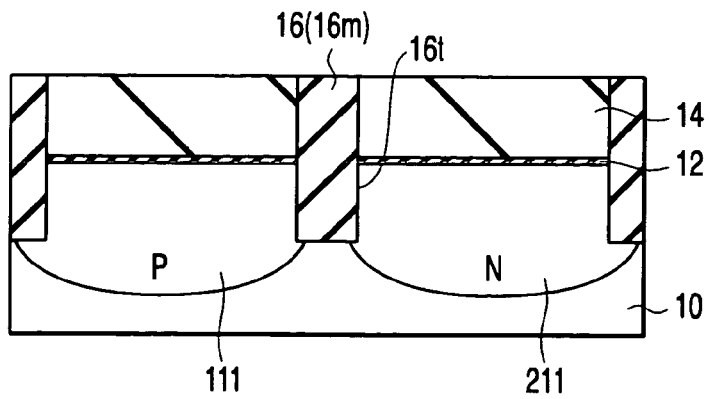
Figure 4A:
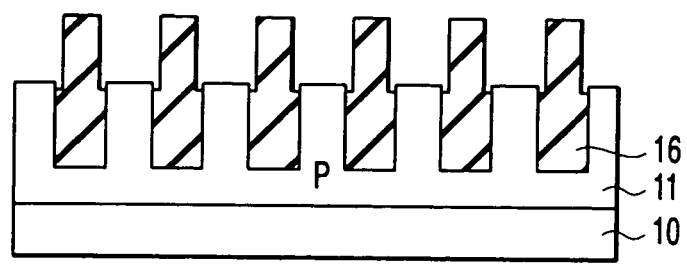
Figure 4B:
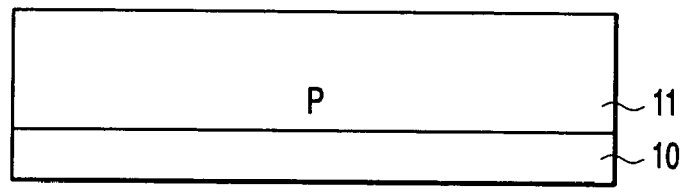
Figure 4C:
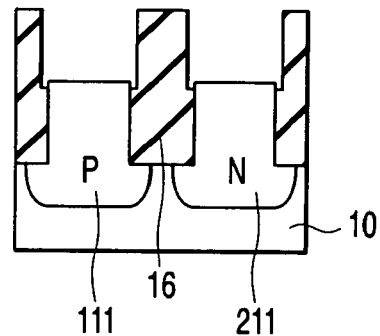
Figure 4D:
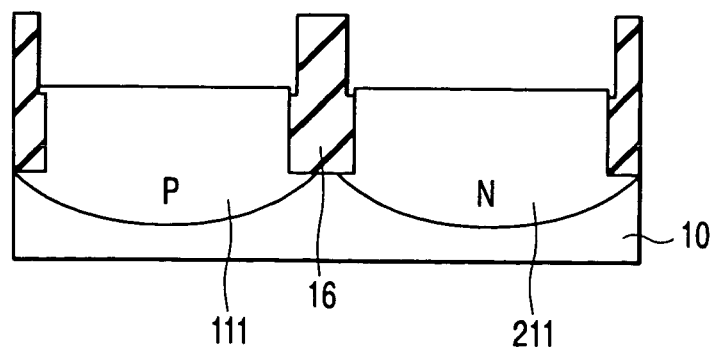

FIGS. 2A to 2D show an example of a cross-sectional configuration of the semiconductor device according to the embodiment. FIG. 2A is a cross-sectional view of a memory cell in the word line direction on the control gate electrode 30 taken along a cutting-plane line 2A-2A in FIG. 1, FIG. 2B is a cross-sectional view of the memory cell in the bit line direction taken along a cutting-plane line 2B-2B in FIG. 1, FIG. 2C is a cross-sectional view of a MOSFET of a peripheral circuit in a channel width direction, and FIG. 2D is a cross-sectional view of the MOSFET of the peripheral circuit in a channel length direction.

The embodiment comprises cell transistors 20 and an n channel MOSFET (which will be referred to as an nMOS, hereinafter) 120 and a p channel MOSFET (which will be referred to as a pMOS, hereinafter) 220 of a peripheral circuit. These transistors are characterized by being formed on a semiconductor layer 18 formed on a semiconductor substrate 10, e.g., a silicon substrate, between isolations 16 formed to protrude from the silicon substrate 10. A part of the isolation 16 protruding from the silicon substrate 10 is etched in the lateral direction to narrow a width of the isolation. A semiconductor layer 18 is selectively formed on the silicon substrate 10 between isolations 16 by, e.g., selective epitaxial growth to widen an active area (i.e., a channel area). A floating gate electrode 24 and gate electrodes 31, 130 and 230 are formed on the semiconductor layer 18 through a tunnel insulator 22 or a gate insulator 122, 222.

Since a surface of the silicon substrate 10 in the channel area is flattened by the semiconductor layer 18, the tunnel insulator 22 or the gate insulator 122, 222 being formed on the surface can have substantially uniform in thickness. As a result, variations in characteristics of the cell transistor 20 and peripheral transistors 120 and 220 can be reduced without forming a parasitic transistor due to the unevenness in thickness of the tunnel insulator 22 or the gate insulator 122, 222 which is a problem in the prior art.

Figure 14:
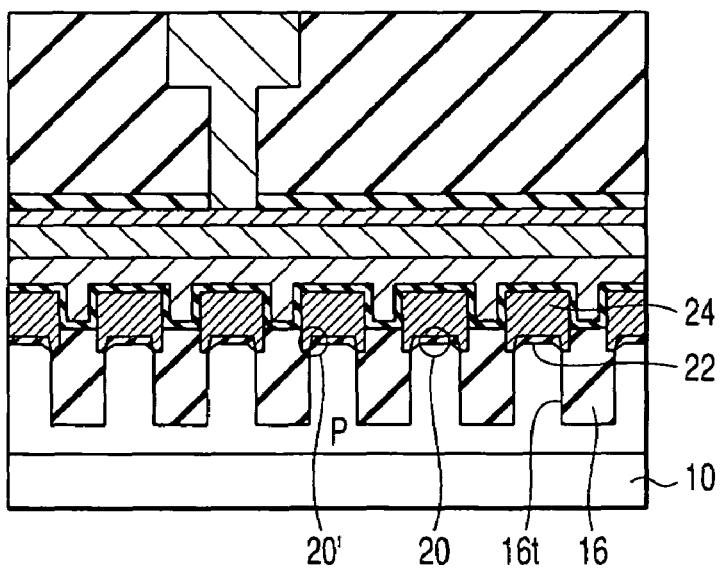
FIG. 14 is a cross-sectional view illustrating a configuration of a semiconductor device according to a prior art.

Further, a width of the channel area of the transistors 20, 120 and 220, i.e., a width of the semiconductor layer 18, becomes wider than a width of the silicon substrate 10 as shown in FIGS. 2A and 2C. As a result, a channel width can be increased as compared with a conventional transistor (see FIG. 14) in which a channel is formed on a silicon substrate, thereby increasing the current driving capability of the transistors.

An example of manufacturing steps of the semiconductor device according to the present embodiment will now be described with reference to FIGS. 3A to 13D. Each figure A in respective drawings is a cross-sectional view of the memory cell in the word line direction on the control gate electrode 30 taken along the cutting-plane line 2A-2A in FIG. 1, and each figure B of the same is a cross-sectional view of the memory cell in the bit line direction taken along the cutting-plane line 2B-2B in FIG. 1. Each figure C is a cross-sectional view of MOSFETs of a peripheral circuit in a channel width direction, and each figure D is a cross-sectional view of the MOSFETs of the peripheral circuit in a channel length direction.

(1) First, an isolation 16 is being formed in the semiconductor substrate 10 in which wells 11, 111 and 211 are formed.

Referring to FIGS. 3A to 3D, in the silicon substrate 10, p-wells 11 and 111 are formed in a memory cell area and an nMOS area of a peripheral circuit, and an n-well 211 is formed in a pMOS area of the peripheral circuit.

Then, a first insulator 12 and a second insulator 14 are sequentially deposited on an entire surface of the silicon substrate 10. As the first insulator 12, it can be used a silicon oxide film (SiO$_2$ film) having a film thickness range of, e.g., 10 nm to 50 nm. As the second insulator 14, it can be used a silicon nitride film (SiN film) having a film thickness range of, e.g., 20 nm to 300 nm. The second insulator 14 serves as a mask in the next patterning process.

A pattern of an isolation 16 is formed on the second insulator 14 by lithography and etching, and the silicon substrate 10 is etched with the second insulator 14 being used as a mask, thereby forming an isolation trench 16t. Then, an isolation insulator 16m is deposited on an entire surface to fill the trench 16t. As the isolation insulator 16m, it can be used SiO$_2$ film formed by a chemical vapor deposition (CVD) or a high density plasma (HDP) deposition, or a high temperature oxide (HTO) deposited at a temperature of 700° C. to 900° C.

The isolation insulator 16m deposited on the second insulator 14 is removed by, e.g., a chemical mechanical polishing (CMP), thereby the surface thereof is planarized. The second insulator 14 is used as a stopper in the CMP.

In this manner, the isolation 16 configured to protrude from the silicon substrate 10 can be formed in and above the silicon substrate 10 as shown in FIGS. 3A to 3D.

(2) Then, the first insulator 12 and the second insulator 14 are being removed and a width of the isolation 16 is being narrowed.

Referring to FIGS. 4A to 4D, the second insulator 14 is removed first. If the second insulator 14 is SiN film, only the second insulator 14 can be selectively remove by etching using, e.g., a hot phosphoric acid.

Subsequently, the first insulator 12 is removed by etching using, e.g., a solution containing hydrofluoric acid, to expose the silicon substrate 10 in an area between the isolations 16. An over-etching is carried out in the etching so that a part of the isolation 16 protruding from the silicon substrate 10 is etched in a lateral direction. That is, a width of the isolation 16 above the silicon substrate 10 is narrowed. In addition, another part of the isolation 16 which is in contact with the silicon substrate 10 is also recessed downward during the over-etching, and hence an upper portion of the silicon substrate 10 slightly protrudes from the adjacent recessed isolation 16.

In this manner, as shown in FIGS. 4A to 4D, the isolation 16 configured to protrude from the silicon substrate 10 is formed, and a distance between the isolations 16 above the silicon substrate 10 can be formed wider than a width of the surface of the exposed silicon substrate 10.

(3) Next, a semiconductor layer 18 is being selectively formed on the silicon substrate 10 in the area between the isolations 16.

Referring to FIGS. 5A to 5D, the semiconductor layer 18 is selectively formed only on the silicon substrate 10 whose upper portion is slightly protruding between the isolations 16. Selective formation of the semiconductor layer 18 can be carried out by, e.g., selective epitaxial growth. As the semiconductor layer 18, it can be used, e.g., silicon or silicon germanium (SiGe). As processing conditions for selective epitaxial growth of silicon, for example, hydrogen (H$_2$) gas is used as a carrier gas with adding several % of hydrogen chloride (HCl), and dichlorsilane (SiH$_2$Cl$_2$) is used as a source gas, a growth temperature is 700° C. to 850° C., and a pressure is 10 Torr to 60 Torr.

The formed semiconductor layer 18 excellently covers the silicon substrate 10 between the isolations 16, and hence the surface of the semiconductor layer 18 is flattened.

Alternatively, the semiconductor layer 18 can also be formed by solid-phase epitaxial growth. In this case, for example, amorphous or polycrystal semiconductor, i.e., silicon or SiGe, is selectively or entirely deposited on the silicon substrate 10 between the isolations 16. When the semiconductor layer 18 is deposited on the entire surface, the semiconductor layer 18 is left by, e.g., etching back only on the surface of the silicon substrate 10 between the isolations 16. Thereafter, a heat treatment is carried out to cause solid-phase epitaxial growth, thereby forming a single-crystal semiconductor layer 18. Otherwise, the amorphous or polycrystal semiconductor layer 18 can be used as it is without performing the heat treatment.

When a semiconductor whose carrier mobility is larger than that of silicon, e.g., SiGe, is used for the semiconductor layer 18, a semiconductor device which can operate at a higher speed can be produced.

Figure 5A:
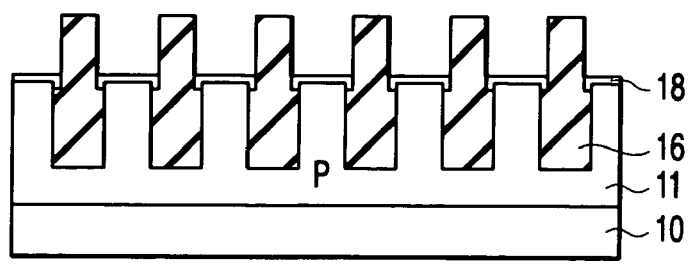
Figure 5B:
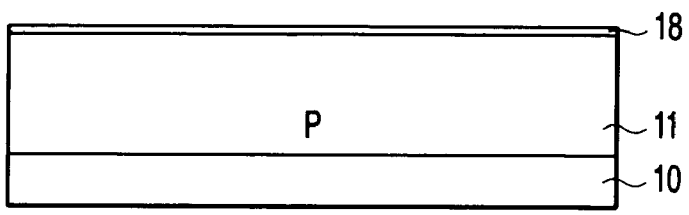
Figure 5C:
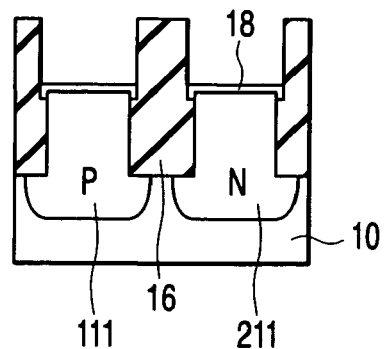
Figure 5D:
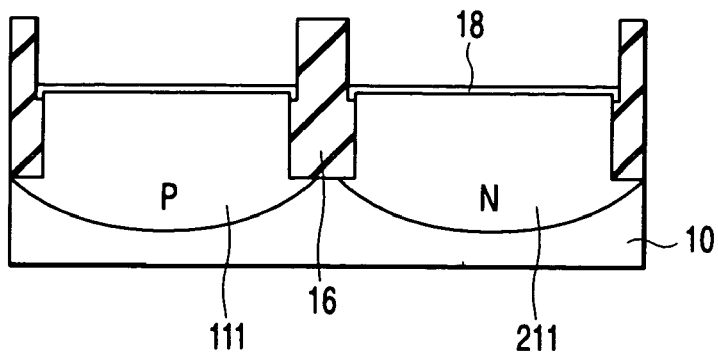
Figure 6A:
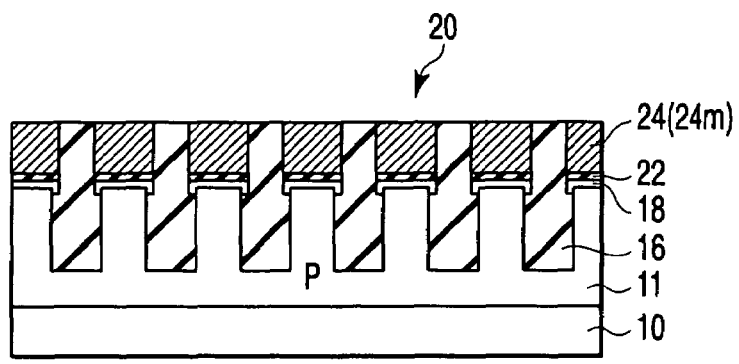
Figure 6B:
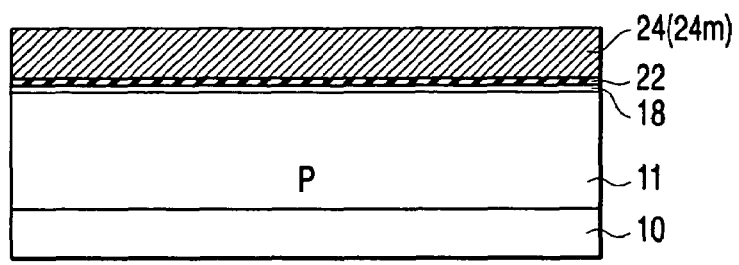
Figure 6C:
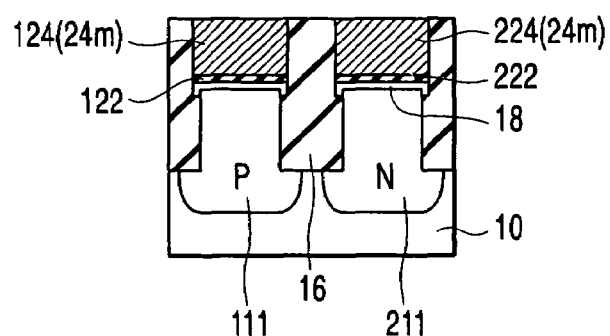
Figure 6D:
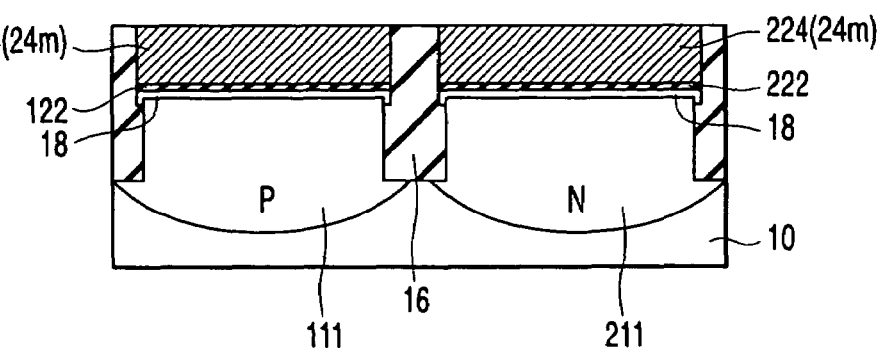

In this manner, as shown in FIGS. 5A to SD, the semiconductor layer 18 can be selectively formed on the silicon substrate 10 between the isolations 16. As a result, the surface of the semiconductor layer 18 can be flattened, and a width of the semiconductor layer 18 can be increased to be wider than a width of the underlying silicon substrate 10.

(4) Then, a first conductor film 24m is being formed on the semiconductor layer 18 through a third (tunnel) insulator 22 or fourth (gate) insulator 122, 222.

Referring to FIGS. 6A to 6D, the third insulator 22 is formed on the semiconductor layer 18 in the memory cell area. The third insulator 22 serves as a tunnel insulator of an NAND type non-volatile semiconductor storage device. As the third insulator 22, it can be used SiO$_2$ film or a silicon oxynitride film (SiON film) having a film thickness range of, e.g., 4 nm to 12 nm. The fourth insulator 122, 222 is formed on the semiconductor layer 18 in the peripheral circuit area. As the fourth insulator 122, 222, it can be used SiO$_2$ film or SiON film having a film thickness range of, e.g., 4 nm to 10 nm.

Then, the first conductor film 24m is deposited on the entire surface including on the third insulator 22 and the fourth insulator 122, 222 to fill a groove between the isolations 16. As the first conductor film 24m, it can be used, e.g., polycrystal silicon doped with high concentration of phosphorous or boron. The above-described impurity can be doped simultaneously in the formation of the polycrystal silicon film. Alternatively, after forming a non-doped polycrystal silicon film, a desired amount of a desired impurity can be doped by, e.g., ion implantation. Then, the first conductor film 24m deposited on the isolations 16 is removed by, e.g., CMP with isolation 16 being used as a stopper to form a floating electrode 24 and first conductor films 124, 224.

In this manner, as shown in FIGS. 6A to 6D, the floating gate electrode 24 of the cell transistor 20 can be formed in the memory cell area, and the first conductor film 124, 224 for gate electrode of the nMOS and the PMOS can be formed in the peripheral circuit area.

(5) Next, the upper portion of the isolation insulator 16 in the memory cell area is being recessed, then a fifth insulator (an inter-gate insulator) 26 and a second semiconductor film 32 are being formed. The second semiconductor film 32 serves as a part of a control gate electrode 30 and gate electrodes 31, 130 and 230.

Figure 7A:
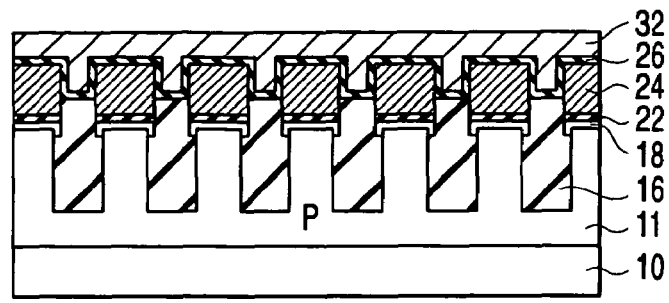
Figure 7B:
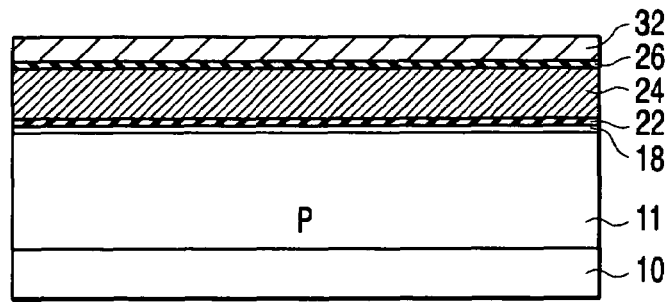
Figure 7C:
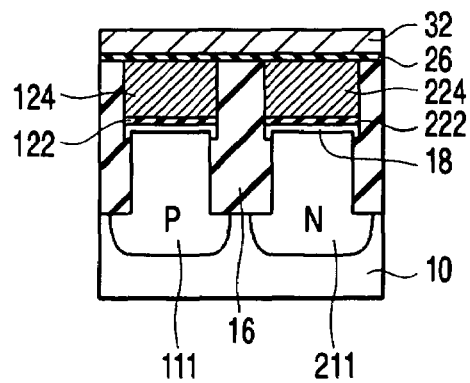
Figure 7D:
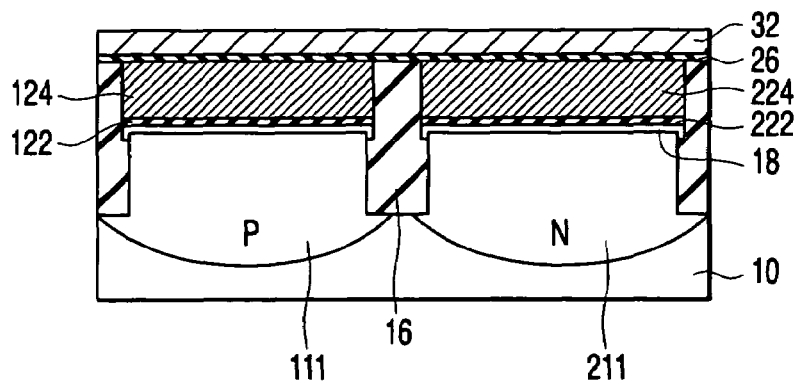
Figure 8A:
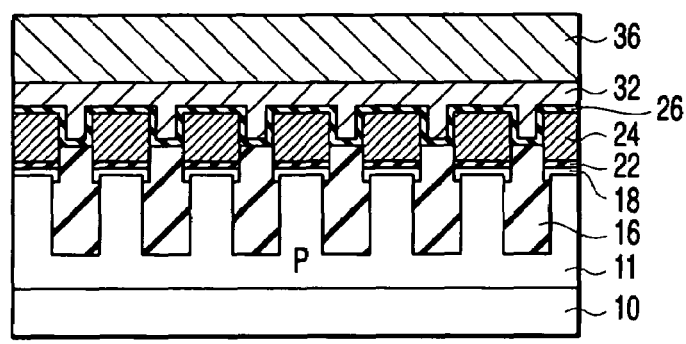
Figure 8B:
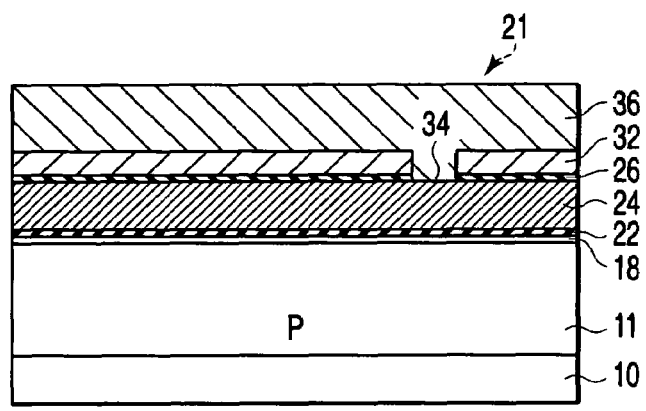
Figure 8C:
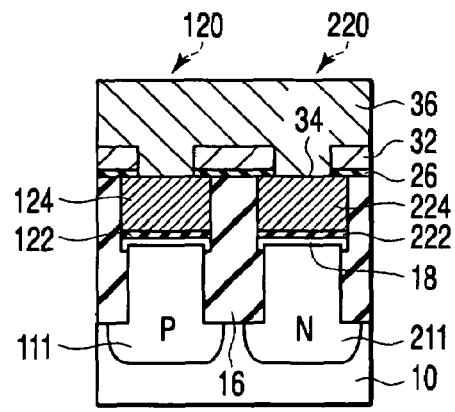
Figure 8D:
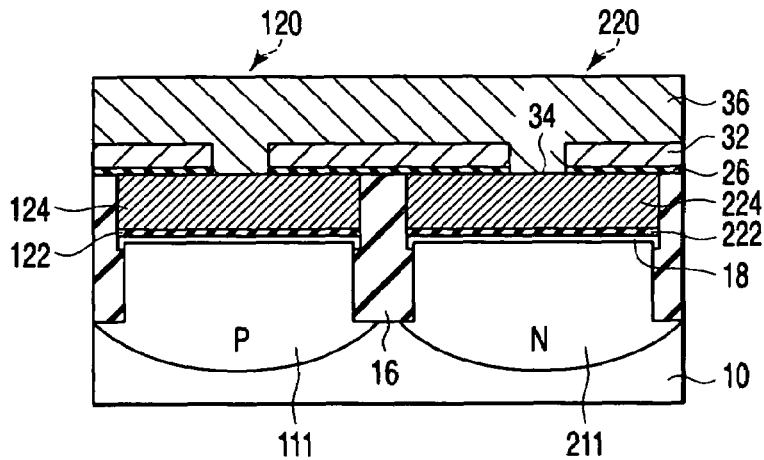

Referring to FIGS. 7A to 7D, an area other than the memory cell area is covered with a resist (not shown), and a desired quantity of the upper portion of the isolation 16 in the memory cell area is removed by etching so that a side surface of the floating gate electrode 24 is partially exposed. As shown in FIG. 7A, a height of the remaining isolation 16 must not be lower than a level of a boundary between the floating gate electrode 24 and the third insulator 22 as the tunnel insulator. By exposing the upper surface and a part of the side surface of the floating gate electrode 24 in this manner, an area interposed between the floating agate electrode 24 and the control gate electrode 30 to be formed on the floating gate electrode 24 in a later step can be increased as compared with the case where the upper surface alone of the floating gate electrode 24 is exposed, i.e., an inter-electrode capacitance can be increased.

Thereafter, the resist in the area other than the memory cell area is removed, and a fifth insulator 26 is deposited on the entire surface. The fifth insulator 26 serves as an inter-gate insulator between the floating gate electrode 24 and the control gate electrode 30. As the fifth insulator 26, it can be used $SiO_2$ film having a film thickness range of 8 nm to 20 nm, or a so-called ONO film having a three-layered configuration consisting of $SiO_2$ film, SiN film and $SiO_2$ film and each having film thickness range of 3 nm to 10 nm.

Further, a second conductor film 32 is formed on the entire surface of the fifth insulator 26. The second conductor film 32 serves as a part of the control gate electrode 30 and the gate electrodes 31, 130 and 230. As the second conductor film 32, it can be used polycrystal silicon doped with phosphorous or boron at a high concentration like the first conductor film 24. The surface of the memory cell area is flattened by the second conductor film 32.

In this manner, the configuration shown in FIGS. 7A to 7D can be formed.

(6) Subsequently, the first conductor film 24 and a third conductor film 36 are being connected with each other through a gate electrode contact hole 34 in an area of the bit line select transistor of the memory cell or the nMOS or the pMOS of the peripheral circuit.

Referring to FIGS. 8A to 8D, a gate electrode contact hole 34 is formed in the area where the gate electrode of the bit line select transistor 21 of the memory cell or the nMOS 120 or the pMOS 220 of the peripheral circuit is formed. That is, the second conductor film 32 and the fifth insulator 26 are removed by lithography and etching to form the gate electrode contact hole 34 and to expose the first conductor film 24. In the area of the peripheral circuit, in place of partially removing the second conductor film 32 and the fifth insulator 26 to form the gate electrode contact hole 34, all of these films can be removed.

Thereafter, a third conductor film 36 is formed on the entire surface including on the gate electrode contact hole 34. As the third conductor film 36, it can be used polycrystal silicon doped with phosphorous or boron at a high concentration like the first and second conductor films 24, 32.

In this manner, as shown in FIGS. 8A to 8D, it can be formed the configuration in which the first conductor film 24 and the third conductor film 36 are connected with each other through the gate electrode contact hole 34 in the area where the bit line select transistor 21 and the peripheral transistors 120, 220 are formed.

(7) Subsequently, gate electrodes 31, 130, 230 are being patterned, and then a first diffusion layer 42 is being formed.

Referring to FIGS. 9A to 9D, a sixth insulator 40 is formed on the entire surface of the third conductor film 36. The sixth insulator 40 serves as a mask in the next gate electrode processing. As the sixth insulator 40, it can be used $SiO_2$ film or SiN film formed by, e.g., CVD, HTO or the like. Patterns of the control gate electrode 30, the gate electrode 31 of the bit line select transistor 21 and the gate electrodes 130 and 230 of the peripheral transistor are formed on the sixth insulator 40 by lithography and etching. With the sixth insulator 40 being used as a mask, the third conductor film 36, the second conductor film 32, the fifth insulator 26, the first conductor film 24 and the third insulator 22 or the fourth insulator 122, 222 are sequentially removed by etching in order to form the control gate electrode 30 of the memory cell, the bit line select gate electrode 31 and the gate electrodes 130 and 230 of the peripheral transistor. The floating gate electrode 24 is divided into individual cell transistors 20 by this etching, thereby forming an array of cell transistors 20. Although not shown, the surface of the semiconductor layer 18 may be slightly etched in the etching in some cases due to completely removing the third insulator 22 or the fourth insulator 122, 222 formed thereon.

Figure 9A:
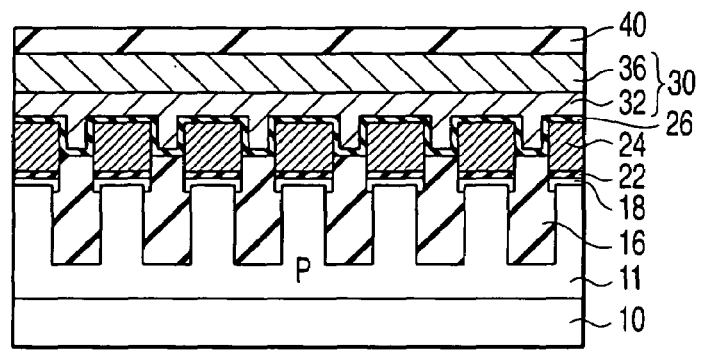
Figure 9B:
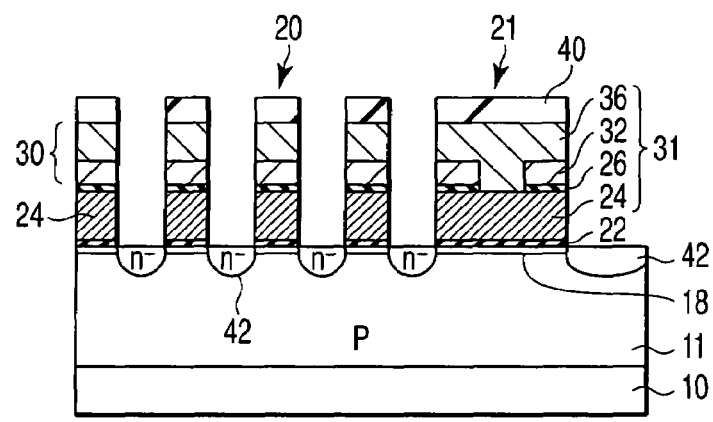
Figure 9C:
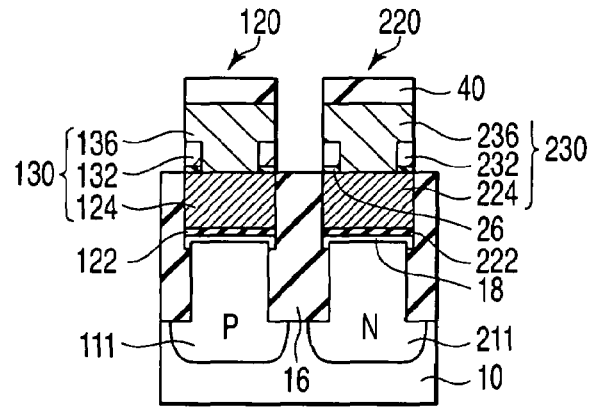
Figure 9D:
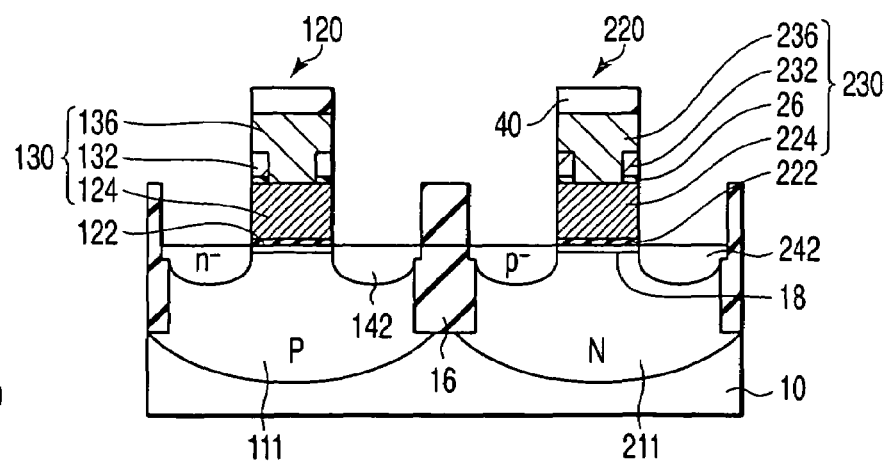
Figure 10A:
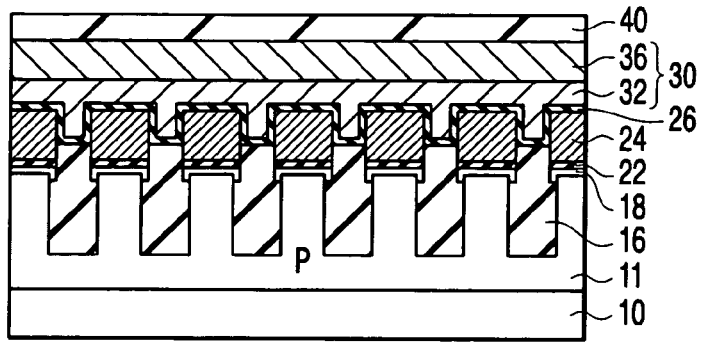
Figure 10B:
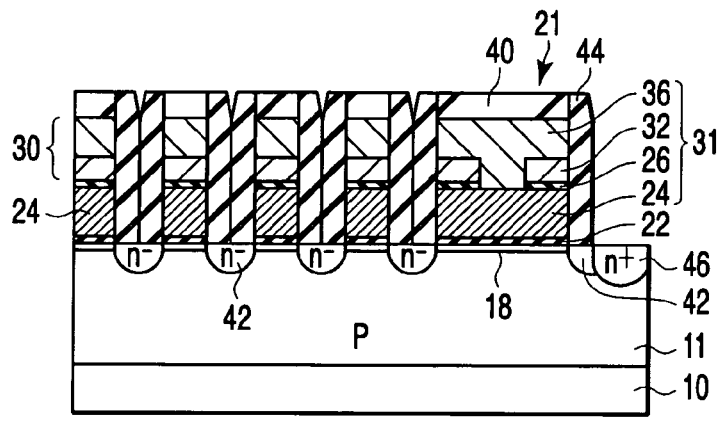
Figure 10C:
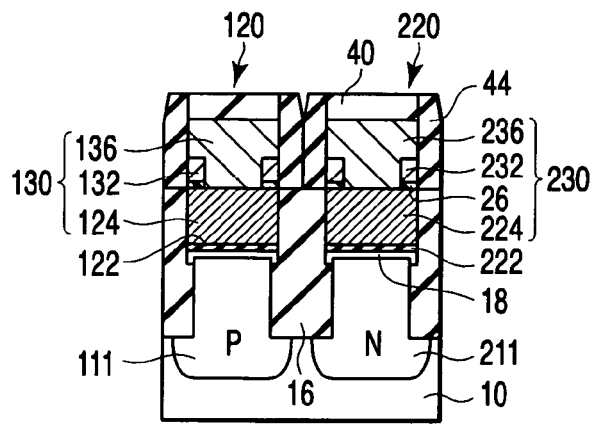
Figure 10D:
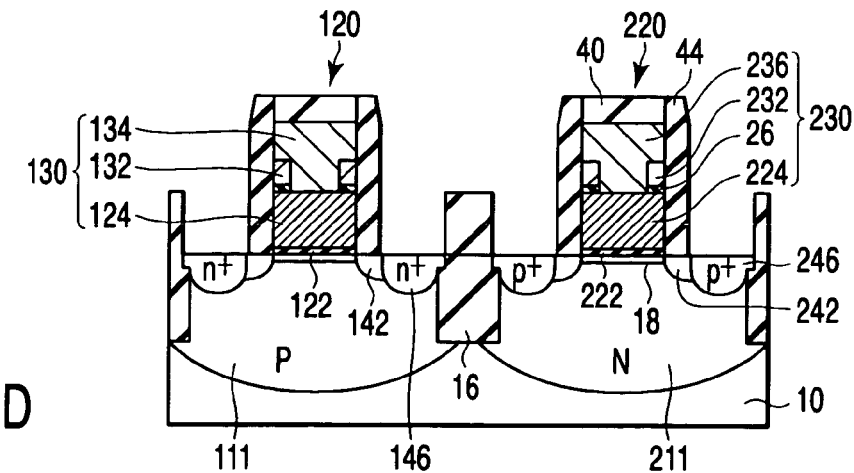
Figure 11A:
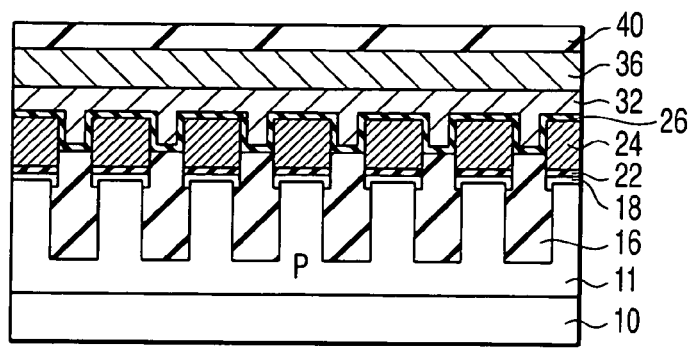
Figure 11B:
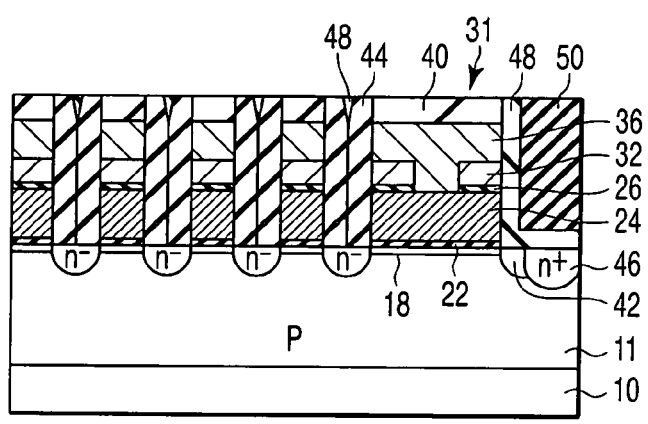
Figure 11C:
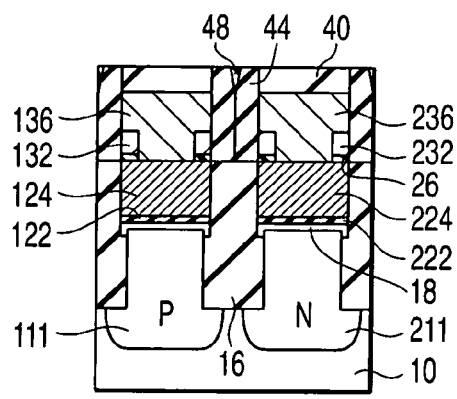
Figure 11D:
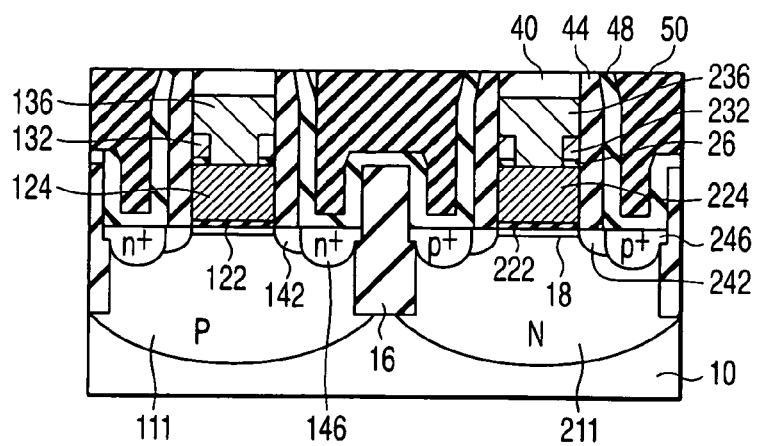
Figure 12A:
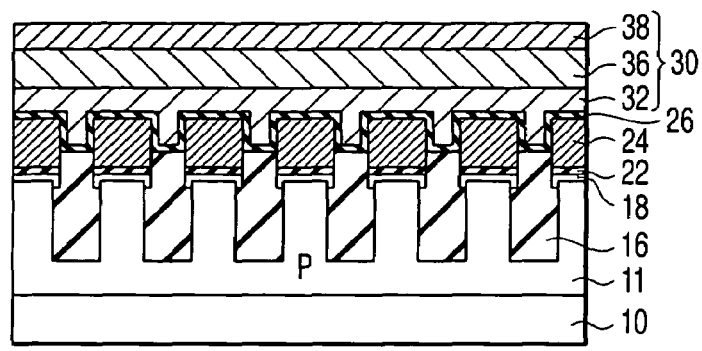
Figure 12B:
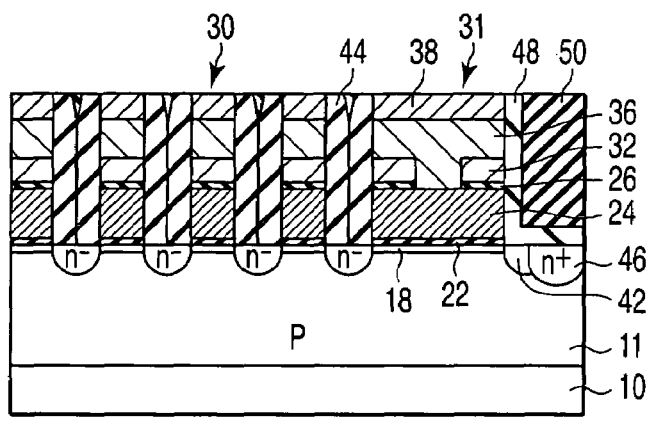
Figure 12C:
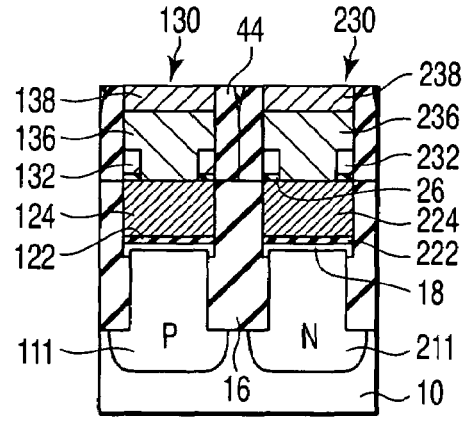
Figure 12D:
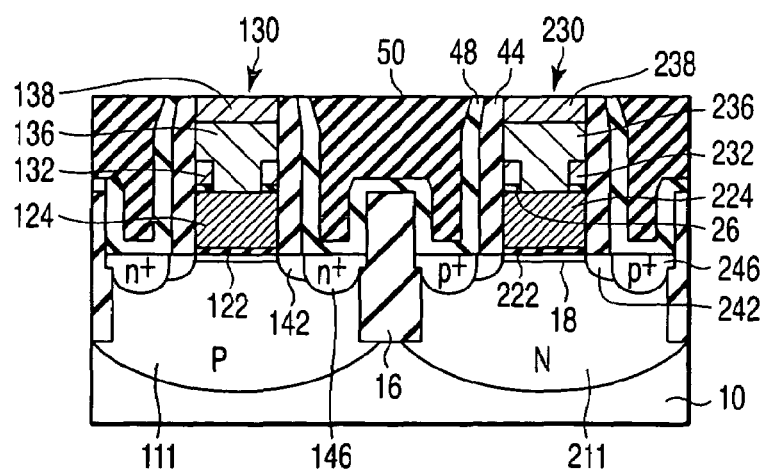
Figure 13A:
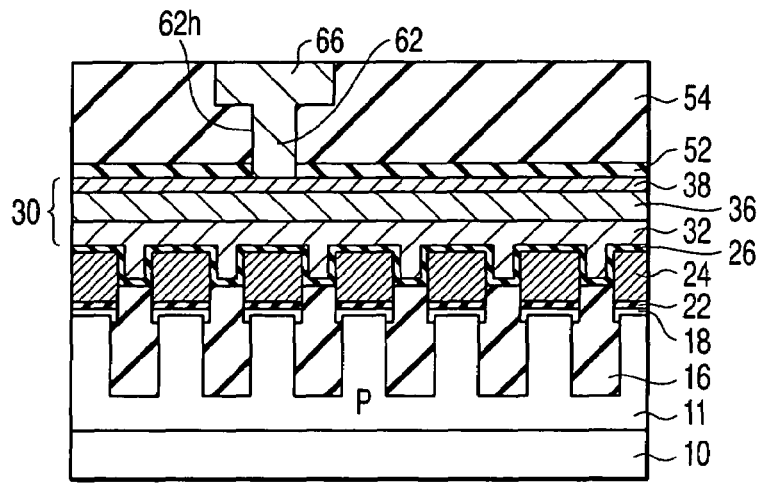
Figure 13B:
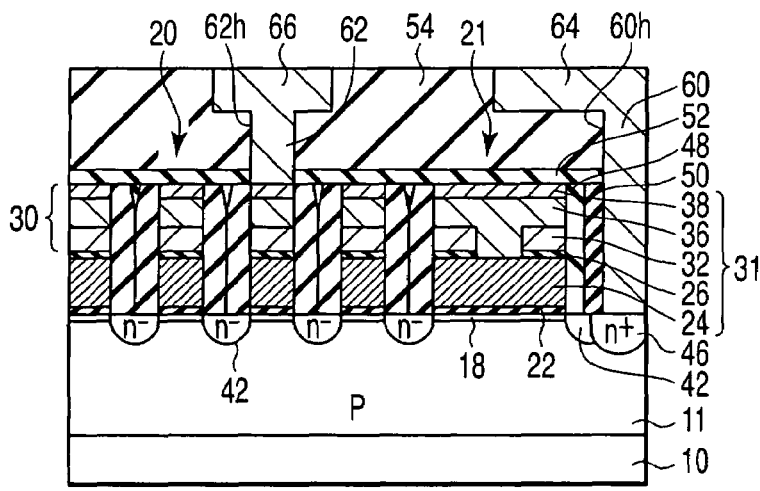
Figure 13C:
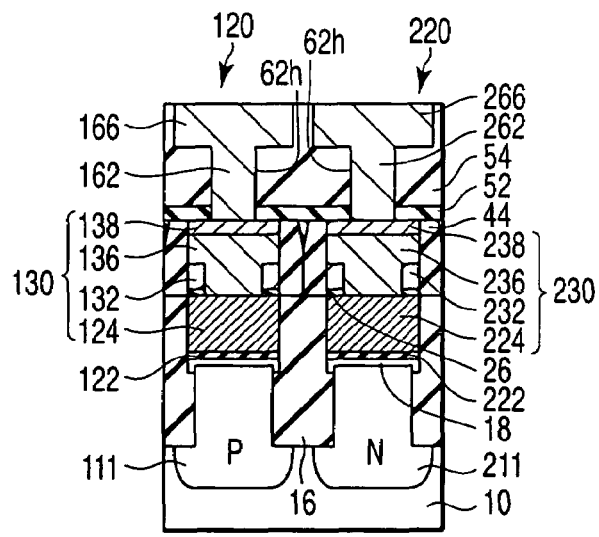
Figure 13D:
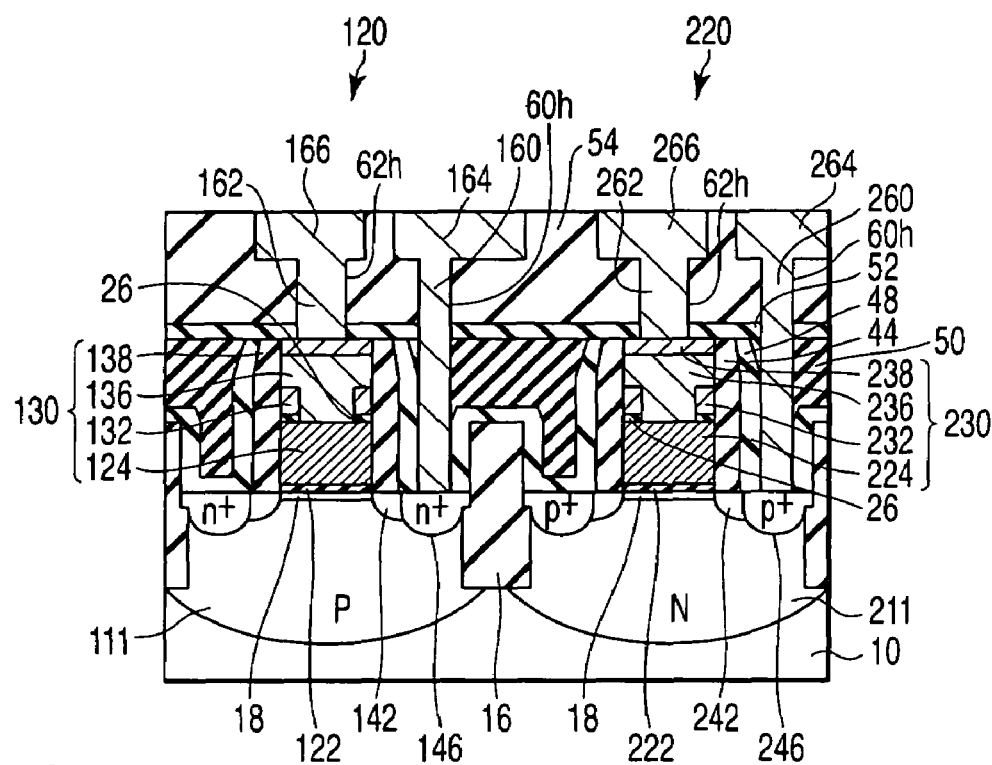

With the respective gate electrodes 24, 31, 130 and 230 being used as masks, impurities are doped into the silicon substrate 10 by, e.g., ion implantation, thereby forming first diffusion layers 42, 142 and 242. The first diffusion layers 42 and 142 of the memory cell and the nMOS are n-type in which an n-type impurity, e.g., arsenic, is doped, and the first diffusion layer 242 of the pMOS is p-type in which a p-type impurity, e.g., boron, is doped. It is to be noted that ion implantation in the memory cell and ion implantation in the peripheral transistor can be simultaneously or separately performed. The plurality of cell transistors 20 in the same column are electrically connected in the bit line direction by the first diffusion layers 42 formed between the cell transistors 20 as shown in FIG. 9B.

In this manner, as shown in FIGS. 9A to 9D, it can be formed the control gate electrode 30, the bit line select gate electrode 31, and the floating gate electrode 24 of the memory cell, the gate electrodes 130 and 230 of the peripheral transistor, and the first diffusion layers 42, 142 and 242.

(8) Then, a sidewall insulator 44 is being formed to each of the gate electrodes 24, 30, 31, 130 and 230, and second diffusion layers 46, 146 and 246 are being formed.

Referring to FIGS. 10A to 10D, a seventh insulator 44 is formed on the entire surface to cover side surfaces of the respective gate electrodes 24, 30, 31, 130 and 230. Each groove between the cell transistors 20 in the bit line direction is filled with the seventh insulator 44. The seventh insulator 44 is formed of a material different from that of the sixth insulator 40 and, for example, SiN film or $SiO_2$ film can be used as the seventh insulator 44. Subsequently, the seventh insulator 44 deposited on the horizontal surface of the sixth insulator 40 and the silicon substrate 10 is removed by anisotropic etching so that the seventh insulator 44 is left only on the side surfaces of the respective gate electrodes 24, 30, 31, 130 and 230. In this manner, the sidewall insulator 44 can be formed on the side surfaces of each gate electrode.

Thereafter, with the respective gate electrodes 24, 30, 31, 130 and 230 and the sidewall insulator 44 being used as masks, impurities are doped into the exposed silicon substrate 10 by, e.g., ion implantation to form second diffusion layers 46, 146 and 246. Ion implantation for the second diffusion layers is carried out with a higher energy and a high concentration than those of the first diffusion layers. As a result, the second diffusion layers can be formed with a deeper junction depth and a higher concentration than those of the first diffusion layers. As an impurity to be implanted, an n-type impurity, e.g., arsenic, is doped to the second diffusion layers 46 and 146 of the bit line select gate transistor 21 and the nMOS 120, and a p-type impurity, e.g., boron, is doped to the second diffusion layer 246 of the pMOS 220 like the first diffusion layers. It is to be noted that ion implantation in the memory cell and ion implantation in the peripheral transistor can be simultaneously or separately carried out. The first and second diffusion layers serve as source/drain of the MOSFET.

In this manner, as shown in FIGS. 10A to 10D, the sidewall insulator 44 of the respective gate electrodes 24, 30, 31, 130 and 230 and the second diffusion layers 46, 146 and 246 can be formed.

(9) Subsequently, an opening above the second diffusion layer 46 is being filled with a ninth insulator 50, and then a surface of the ninth insulator 50 is being planarized.

Referring to FIGS. 11A to 11D, the sidewall insulator 44 of the bit line select gate electrode 31 on the second diffusion layer 46 side is removed by lithography and etching as required. Although a bit line contact 60 is being formed on the second diffusion layer 46 later, the sidewall insulator 44 may not be removed if a dimensional margin is large enough.

Then, an eighth insulator 48 is formed on the entire surface to cover the side surfaces of the bit line select gate electrode 31 from which the sidewall insulator 44 has been removed. Furthermore, the ninth insulator 50 is formed on the entire surface to fill the openings above the second diffusion layers 46, 146 and 246. The ninth insulator 50 formed on the eight insulator 48 and the eighth insulator 48 are removed by, e.g., CMP with the sixth insulator 40 being used as a stopper, thereby planarizing the surface. As the eighth insulator 48, it can be used, e.g., a CVD-SiO$_2$ film whose polishing rate by CMP is lower than that of the ninth insulator 50 but higher than that of the sixth insulator 40. As the ninth insulator 50, it can be used, e.g., a low-dielectric-constant insulator or a TEOS-SiO$_2$ film. It is to be noted that the eighth insulator 48 can be eliminated.

In this manner, as shown in FIGS. 11A to 11D, it can be formed the configuration in which the surface of the sixth insulator 40 is planarized.

(10) Then, a silicide 38 is being formed on upper surfaces of the control gate electrode 30, the bit line select gate electrode 31 and the gate electrodes 130 and 230 of the peripheral transistor.

Referring to FIGS. 12A to 12D, the sixth insulator 40 on each of the control gate electrode 30, the bit line select gate electrode 31 and the gate electrodes 124 and 224 of the peripheral transistor is removed so that the third conductor film 36, i.e., polycrystal silicon, in the upper surface of each gate electrode is exposed. A silicide metal (not shown) is deposited on the entire surface. As the silicide metal, it can be used, e.g., tungsten (W), nickel (Ni), cobalt (Co) or the like. A heat treatment is carried out in a state where the silicide metal is in contact with polycrystal silicon to cause a reaction so that a silicide 38 is formed on the upper part of polycrystal silicon 36 of the gate electrode. Thereafter, the unreacted silicide metal is removed.

In this manner, as shown in FIGS. 12A to 12D, it can be formed the gate electrodes 30, 31, 124 and 224 having a so-called salicide structure in which the silicide 38 is formed on the polycrystal silicon 36.

(11) Subsequently, wirings 64 and 66 are being formed.

Referring to FIGS. 13A to 13D, a tenth insulator 52 is formed on the entire surface including the upper surfaces of the gate electrodes 30, 31, 124 and 224 in which the silicide 38 is formed. As the tenth insulator 52, an insulator having a function of preventing a metal from being diffused from the silicide 38 is preferable, and it can be used, e.g., SiN film. An eleventh insulator 54 is formed on the entire surface of the tenth insulator 52. The eleventh insulator 54 is an interlevel insulator of wirings and, for example, a low-dielectric-constant insulator can be used.

Then, a first contact hole 60h reaching the second diffusion layer 46 of the memory cell or the second diffusion layer 146, 246 of the peripheral transistor is formed in the eleventh insulator 54, the tenth insulator 52, the ninth insulator 50 and the eighth insulator 48 by lithography and etching. A metal, e.g., tungsten (W) is filled in the first contact hole 60h to form first contact plugs 60, 160 and 260. Likewise, a second contact hole 62h reaching the control gate electrode 30 of the memory cell or the gate electrode 130, 230 of the peripheral transistor is formed by lithography and etching and, for example, tungsten (W) is filled in the second contact holes 62h to form second contact plugs 62, 162 and 262.

A wiring metal, e.g., tungsten (W) is formed on the entire surface including the upper surfaces of the first and second contact plugs 60, 160, 260, 62, 162 and 262, and patterned by lithography and etching, thereby forming first wirings 64, 164 and 264 being connected with the first contact plugs 60, 160 and 260 and second wirings 66, 166 and 266 being connected with the second contact plugs 62, 162 and 262.

Thereafter, processes required for the semiconductor device, e.g., multi-level wiring or the like are carried out to bring the semiconductor device to completion. The thus formed semiconductor device is a semiconductor device which can improve variations in characteristics and enhance the current driving capability and is suitable for miniaturization.

As described above, according to the present invention, it can be solved various problems in the semiconductor device of the prior art in which the isolations protruding from the semiconductor substrate are formed in advance and the MOSFET is formed between the isolations, since the surface of the semiconductor layer where the channel is formed can be flattened by the semiconductor layer selectively formed in the area between the isolations. As a result, variations in characteristics due to fluctuations in film thickness of the tunnel insulator or the gate insulator, such as I-V characteristics of the MOSFET, tunneling current characteristics of the non-volatile storage element and others, can be improved. Moreover, an effective width of the isolation can be reduced and a channel width can be increased, thereby improving the current driving capability of the MOSFET. A semiconductor, e.g., SiGe whose carrier mobility is larger than that of silicon can be used for the semiconductor layer in the channel area, and hence a speed of the semiconductor device can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a plurality of isolation insulators provided in the semiconductor substrate to divide a surface of the semiconductor substrate into a plurality of semiconductor portions, said plurality of isolation insulators having widths varying at a surface level of the semiconductor substrate;
   a semiconductor layer formed on each of the semiconductor substrate portions between the isolation insulators; and
   a MOSFET formed on the semiconductor layer,
   wherein the isolation insulators protrude from the semiconductor layer, and the widths of the isolation insulators above the semiconductor layer are narrower than widths of the isolation insulators in the semiconductor substrate, and wherein a width of the semiconductor layer is wider than the semiconductor substrate portion.

2. The semiconductor device according to claim 1, wherein the semiconductor layer is a semiconductor material different from the semiconductor substrate whose carrier mobility is larger than that of silicon.

3. The semiconductor device according to claim 2, wherein the semiconductor layer includes germanium.

4. The semiconductor device according to claim 1, wherein the semiconductor layer has a flattened surface.

5. The semiconductor device according to claim 1, wherein the semiconductor layer is disposed on the semiconductor substrate portion to fill a full width between the isolation insulators.

6. The semiconductor device according to claim 1, wherein the semiconductor layer is a single-crystal layer.

7. The semiconductor device according to claim 1, wherein the MOSFET includes a non-volatile semiconductor storage element.

8. The semiconductor device according to claim 1, wherein the MOSFET includes a conductor layer provided on an insulating film provided on the semiconductor layer, the conductor layer filling a space above the semiconductor layer and between the isolation insulators.

9. The semiconductor device according to claim 7, wherein the semiconductor layer has a flattened surface.

10. The semiconductor device according to claim 7, wherein the semiconductor layer is a semiconductor material different from the semiconductor substrate whose carrier mobility is larger than that of silicon.

11. The semiconductor device according to claim 7, wherein the semiconductor layer is disposed on the semiconductor substrate portion to fill a full width between the isolation insulators.

12. The semiconductor device according to claim 7, wherein the semiconductor layer is a single-crystal layer.

13. The semiconductor device according to claim 7, wherein the MOSFET includes a conductor layer provided on an insulating film provided on the semiconductor layer, the conductor layer filling a space above the semiconductor layer and between the isolation insulators, and wherein a channel width of the MOSFET is equal to a width of the semiconductor layer between the isolation insulators.

14. The semiconductor device according to claim 10, wherein the semiconductor layer includes germanium.

* * * * *